(12) United States Patent
Hoegerl et al.

(10) Patent No.: US 11,410,906 B2
(45) Date of Patent: Aug. 9, 2022

(54) SEMICONDUCTOR PACKAGE AND METHOD FOR FABRICATING A SEMICONDUCTOR PACKAGE

(71) Applicant: Infineon Technologies AG, Neubiberg (DE)

(72) Inventors: Juergen Hoegerl, Regensburg (DE); Bernd Betz, Obertraubling / Oberhinkofen (DE); Stephan Bradl, Regensburg (DE); Daniel Obermeier, Ensdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/897,804

(22) Filed: Jun. 10, 2020

(65) Prior Publication Data

US 2020/0395266 A1 Dec. 17, 2020

(30) Foreign Application Priority Data

Jun. 11, 2019 (DE) .......................... 102019115857.5

(51) Int. Cl.
| | |
|---|---|
| *H01L 23/367* | (2006.01) |
| *H01L 23/498* | (2006.01) |
| *H01L 23/538* | (2006.01) |
| *H01L 21/48* | (2006.01) |
| *H01L 21/56* | (2006.01) |
| *H01L 23/00* | (2006.01) |

(52) U.S. Cl.
CPC ...... *H01L 23/3675* (2013.01); *H01L 21/4842* (2013.01); *H01L 21/565* (2013.01); *H01L 23/49811* (2013.01); *H01L 23/49838* (2013.01); *H01L 23/49861* (2013.01); *H01L 23/5386* (2013.01); *H01L 24/32* (2013.01); *H01L 24/33* (2013.01); *H01L 24/83* (2013.01); *H01L 2224/32225* (2013.01); *H01L 2224/33181* (2013.01); *H01L 2224/83815* (2013.01)

(58) Field of Classification Search
CPC ......... H01L 24/83; H01L 24/32; H01L 24/33; H01L 23/49861; H01L 23/3675; H01L 23/495; H01L 21/565; H01L 23/367; H01L 23/3677; H01L 23/49562; H01L 23/49531; H01L 23/49811
See application file for complete search history.

(56) References Cited

U.S. PATENT DOCUMENTS

| | | | |
|---|---|---|---|
| 2007/0236891 A1 | 10/2007 | Mamitsu | |
| 2011/0026031 A1* | 10/2011 | Minotti | H01L 23/49562 257/693 |

FOREIGN PATENT DOCUMENTS

| | | |
|---|---|---|
| JP | 2012146760 A | 8/2012 |
| JP | 5930565 B1 | 5/2016 |

* cited by examiner

*Primary Examiner* — Jasmine J Clark
(74) *Attorney, Agent, or Firm* — Murphy, Bilak & Homiller, PLLC (57) ABSTRACT

A semiconductor package for double sided cooling includes a first and a second carrier facing each other, at least one power semiconductor chip arranged between the first and second carriers, external contacts arranged at least partially between the first and second carriers, and spring elements arranged between the first and second carriers and configured to keep the first and second carriers at a predefined distance from each other.

16 Claims, 4 Drawing Sheets

SEMICONDUCTOR PACKAGE AND METHOD FOR FABRICATING A SEMICONDUCTOR PACKAGE

TECHNICAL FIELD

This disclosure relates in general to a semiconductor package and to a method for fabricating a semiconductor package.

BACKGROUND

A semiconductor package, in particular a semiconductor package suitable for double side cooling, may comprise two carriers that are arranged opposite to each other forming a "sandwich structure" and one or more semiconductor chips, in particular power semiconductor chips, arranged between the carriers. Furthermore, the carriers may be configured for attaching cooling structures like heatsinks to their external surfaces. In order to meet e.g. stringent thermal performance requirements, the carriers must have a high level of planarity. Surface irregularities increase the average distance between the carrier and the cooling structure and thereby increase the thermal resistance of the semiconductor package. Providing a satisfactory level of planarity may comprise grinding the external sides of the carriers to remove surface irregularities. The bigger the surface irregularities, the more material has to be ground off the carriers. Improved semiconductor packages and improved methods for fabricating semiconductor packages may reduce or even eliminate surface irregularities of the carriers. Therefore, less material may have to be ground off or grinding may even be omitted altogether. Moreover, inaccuracies in thickness due to roughness or manufacturing tolerances need to be compensated for when mounting the semiconductor package, for example by using relatively thick mounting compounds such as solder. This can lead to reduced heat conduction out of the semiconductor package. Semiconductor packages having an exact thickness with good manufacturing tolerances are therefore desirable.

The problem on which the invention is based is solved by the features of the independent claims. Further advantageous examples are described in the dependent claims.

SUMMARY

Various aspects pertain to a semiconductor package for double sided cooling, the semiconductor package comprising: a first and a second carrier facing each other, at least one power semiconductor chip arranged between the first and second carriers, external contacts arranged at least partially between the first and second carriers, and spring elements arranged between the first and second carriers and configured to keep the first and second carriers at a predefined distance from each other.

Various aspects pertain to a method for fabricating a semiconductor package, the method comprising: arranging a first and a second carrier opposite to each other, arranging at least one power semiconductor chip between the first and second carriers, arranging external contacts at least partially between the first and second carriers, and arranging spring elements between the first and second carriers, the spring elements being configured to keep the first and second carriers at a predefined distance from each other.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

In the following detailed description, directional terminology, such as "top", "bottom", "left", "right", "upper", "lower" etc., may be used with reference to the orientation of the Figure(s) being described. Because components of the disclosure can be positioned in a number of different orientations, the directional terminology is used for purposes of illustration. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other.

The semiconductor chip(s) described further below may be of different types, may be manufactured by different technologies and may be manufactured from specific semiconductor material, for example Si, SiC, SiGe, GaAs, GaN, or from any other semiconductor material.

The examples of a semiconductor package may comprise circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, power integrated circuits, chips with integrated passives, etc. The examples may also use semiconductor chips comprising MOS transistor structures or vertical transistor structures like, for example, IGBT (Insulated Gate Bipolar Transistor) structures.

The semiconductor packages described in the following may be configured for double sided cooling. This may entail that the semiconductor packages are configured to have cooling structures applied on two sides. For example, a semiconductor package for double sided cooling may have a first heatsink arranged on a first external side and a second heatsink arranged on an opposite second external side. Such heatsinks may be configured for liquid cooling or for air cooling. The semiconductor packages may comprise carriers (e.g. DCBs (direct copper bond), DABs (direct aluminum bond), AMBs (active metal brazing), leadframes etc.) that also act as heat conductors and that are at least partially exposed at said opposite sides of the semiconductor packages. The heatsinks may be arranged on the exposed parts of these carriers. Semiconductor packages for such applications may have a thickness that is precisely defined to allow good contact between a heat sink or heat sinks and the semiconductor packages.

Figure 1A:
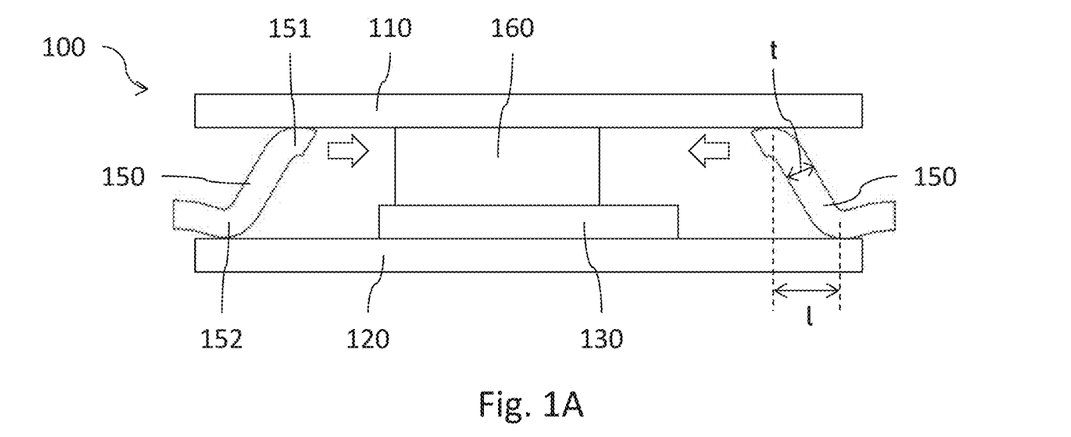
FIGS. 1A and 1B show a side view (FIG. 1A) and a top-down view (FIG. 1B) of a semiconductor package comprising two carriers and spring elements arranged between the two carriers.
Figure 1B:
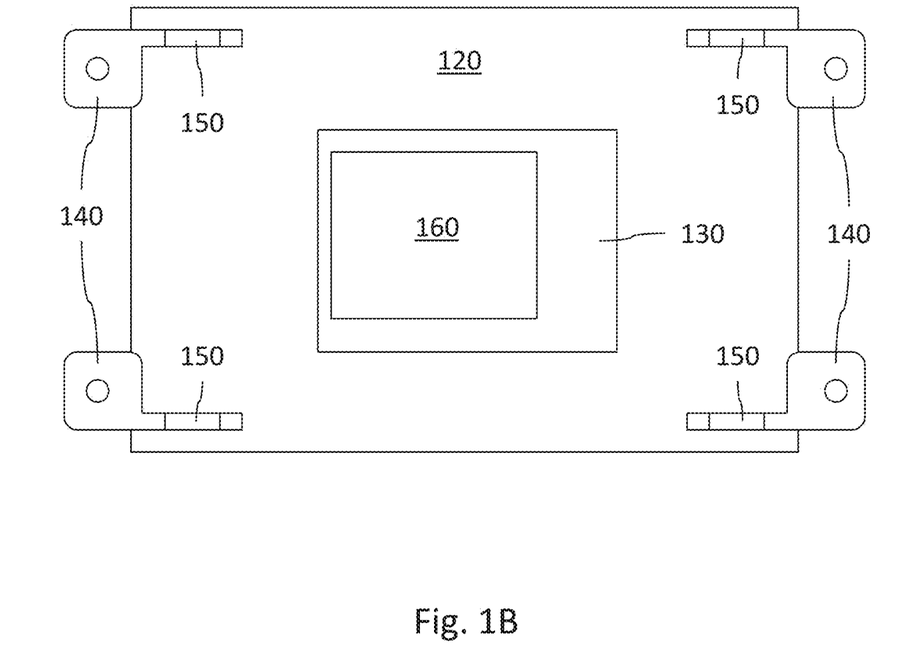

FIG. 1A shows a side view of a semiconductor package 100. The semiconductor package 100 comprises a first carrier 110 and a second carrier 120, wherein the first and second carriers 110, 120 are facing each other. FIG. 1B shows a top down view of semiconductor package 100, wherein the first carrier 110 was omitted in order to show the inside of the semiconductor package 100.

Semiconductor package 100 also comprises at least one power semiconductor chip (or power semiconductor die) 130 arranged between the first and second carriers 110, 120, external contacts 140 arranged at least partially between the first and second carriers 110, 120, and spring elements 150 that as well are arranged between the first and second carriers 110, 120. The spring elements 150 are configured to keep the first and second carriers 110, 120 at a predefined distance from each other.

The carriers 110, 120 may be die carriers of the type DCB, DAB, AMB, leadframe or any other suitable type. The first carrier 110 and the second carrier 120 may be of the same type or they may be of different types. One or both of the carriers 110, 120 may comprise electrically conductive traces, wherein the at least one power semiconductor chip 130 is coupled to the conductive traces. The carriers 110, 120 are arranged such that an inner side of each carrier 110, 120 faces the at least one power semiconductor chip 130 as well as the respective other carrier 110, 120. According to an example, the first carrier 110 and the second carrier 120 are both DCB type carriers.

The at least one power semiconductor chip 130 may comprise a first power electrode that faces the first carrier 110 and is electrically coupled to the first carrier 110 and a second power electrode that faces the second carrier 120 and is electrically coupled to the second carrier 120. The power semiconductor chip 130 may further comprise a control electrode (e.g. a gate electrode) that may be coupled to the first carrier 110 or to the second carrier 120.

The semiconductor package 100 may comprise a multitude of power semiconductor chips like the power semiconductor chip 130, for example 3, 6, 8, 16 or any other suitable number of power semiconductor chips. The multitude of power semiconductor chips may be electrically coupled to the first and/or second carrier 110, 120 to form a specific circuit like e.g. a half-bridge circuit. The semiconductor package may for example be a power converter, an AC/DC converter, a DC/DC converter etc.

The semiconductor package 100 may optionally comprise an electrically conductive first spacer 160 arranged between the power semiconductor chip 130 and one of the carriers 110, 120, e.g. the first carrier 110. The first spacer 160 may be configured to couple a power electrode of the power semiconductor chip 130 to the first carrier 110. The first spacer 160 may for example comprise or consist of a metal like Al, Cu or Fe or a metal alloy. According to another example, the semiconductor package 100 does not comprise the first spacer 160 and the power semiconductor chip 130 is instead directly coupled to the first carrier 110 by a solder deposit.

The external contacts 140 (compare FIG. 1B) may comprise power contacts coupled to power electrodes (e.g. a source, drain, emitter or collector electrode) of the power semiconductor chip 130 and/or control contacts coupled to a control electrode (e.g. a gate electrode) of the power semiconductor chip 130. The example shown in FIG. 1B shows four external contacts 140. However, the semiconductor package 100 may comprise any number of external contacts.

The semiconductor package 100 may comprise an encapsulation (not shown in FIGS. 1A and 1B). The encapsulation may for example comprise a mold material, a polymer or an epoxy. The external contacts 140 are exposed on the encapsulation. Furthermore, at least parts of the outer sides of the first and second carrier 110, 120 (facing away from the power semiconductor chip 130) are exposed from the encapsulation.

The spring elements 150 may for example be arranged at the four corners of the semiconductor package 100. It is also possible that the semiconductor package 100 comprises additional spring elements 150, which may for example be arranged along the edges, the center or any other suitable location within the semiconductor package 100.

The spring elements 150 may comprise or consist of a metal like Al, Cu or Fe or of a metal alloy. The spring elements 150 may for example be parts of a leadframe. According to an example, the external contacts 140 and the spring elements 150 are parts of the same leadframe. Each spring element 150 may in particular be integrally formed with one of the external contacts 140 as shown in the example of FIG. 1B.

Each spring element 150 may touch both the first carrier 110 and the second carrier 120 and may therefore be configured to exert a force aiming to keep the carriers 110, 120 apart. A desired spring force of each spring element 150 may for example be set by choosing an appropriate width w (a thickness t of each spring element 150 may be predefined by the leadframe used and may therefore not be as easily adjustable as the width w).

According to an example, each spring element 150 basically has an S-shape as seen in the side view of FIG. 1A. The S-shape may comprise a first arc 151 and a second arc 152. The first arc 151 may touch the first carrier 110 (in particular, the inner side of the first carrier 110) and the second arc 152 may touch the second carrier 120 (in particular, the inner side of the second carrier 120). The first and the second arc 151, 152 may be laterally displaced by a length l, which may be about 1 mm, 2 mm, 3 mm, 5 mm, 8 mm, 1 cm or more.

According to an example, the spring elements 150 may be electrically insulated from the power semiconductor chip 130 and/or any other part of an electrical circuit comprised in the semiconductor package 100. However, according to another example it is also possible that at least some of the spring elements 150 are coupled to the electrical circuit and electrically couple the first carrier 110 to the second carrier 120.

The spring elements 150 may touch the first carrier 110 and/or the second carrier 120 without being glued to the first carrier 110 and/or the second carrier 120. The spring elements 150 may therefore be configured to slide along the inner surface of the first carrier 110 and/or the inner surface of the second carrier 120. For example, in the case that the first and second carrier 110, 120 are pressed towards each other, the first arcs 151 may slide along the inner surface of the first carrier 110 as indicated by the arrows in FIG. 1A.

Fabrication of the semiconductor package 100 may comprise arranging the power semiconductor chip 130 on the first carrier 110 or on the second carrier 120, arranging both carriers 110, 120 opposite to each other as shown in FIG. 1A, applying pressure onto the carriers 110, 120 such that the carriers 110, 120 are pressed towards each other (and e.g. against the semiconductor chip 130 and the spacer 160) and applying heat to solder the parts of the semiconductor package 100 together. Due to e.g. differences between the inner surface and the outer surface of the carriers 110, 120 (for example: the inner surfaces may comprise conductive traces while the outer surfaces do not), due to the presence of the semiconductor chip 130 on the inner surface, or due to any other factors, the carriers 110, 120 may exhibit a surface curvature or, more generally, surface irregularities.

However, the spring elements 150 may help to counteract such a surface curvature by keeping the carriers 110, 120 at a predefined distance from one another (in particular, by exerting an outwards force onto the corners of the carriers 110, 120). Due to the spring elements 150, the carriers 110, 120 of the semiconductor package 100 may therefore exhibit a better planarity than carriers in a semiconductor package that does not comprise the spring elements 150.

Semiconductor packages like the semiconductor package 100 may be subjected to a planarization treatment after the above-mentioned soldering has been performed. Such a planarization treatment may comprise grinding the outer surfaces of the carriers 110, 120. Due to the inherent planarity of the semiconductor package 100 caused by the spring elements 150, less material may have to be ground off from semiconductor package 100 than from a semiconductor package without the spring elements 150.

Figure 2:
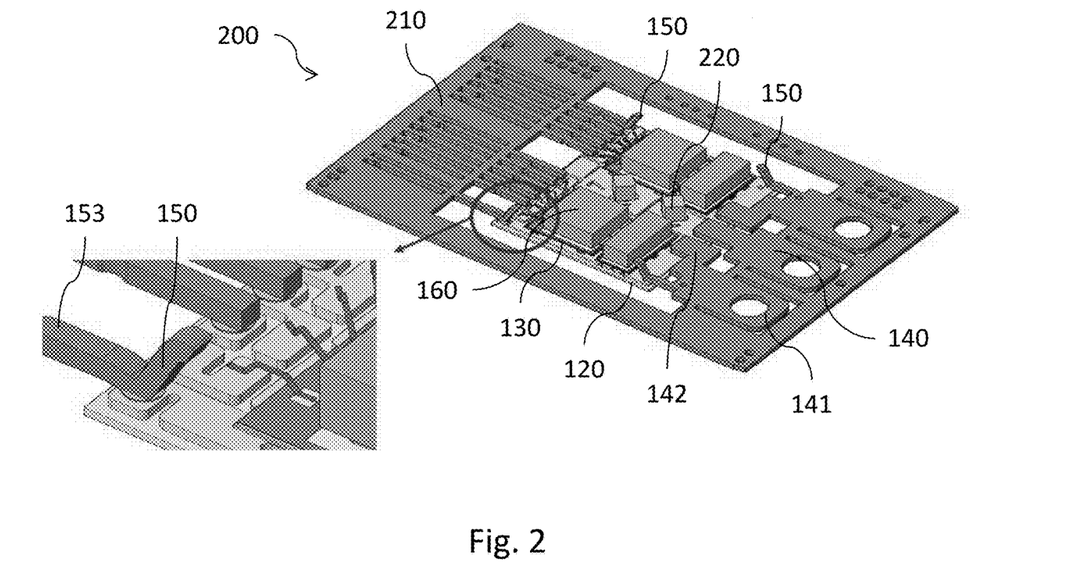
FIG. 2 shows a perspective view of a further semiconductor package, wherein the spring elements are parts of a leadframe.

FIG. 2 shows a perspective view of a semiconductor package 200 in a stage of fabrication. Semiconductor package 200 may be similar or identical to semiconductor package 100, except for the differences described in the following. In order to provide a view of the interior of semiconductor package 200, the first carrier 110 is not shown in FIG. 2.

FIG. 2 shows the external contacts 140 and the spring elements 150 to be part of a common leadframe 210. In the example shown in FIG. 2, a first group of spring elements 150 (shown on the right side in FIG. 2) are formed integrally, in particular monolithically, with respective external contacts 140. A second group of spring elements 150 (shown on the left side in FIG. 2) are not formed integrally with external contacts 140 but instead are separate pieces.

The external contacts 140 may comprise an external part 141 chat is exposed on an encapsulation of the semiconductor package 200 and an internal part 142 that is encapsulated by the encapsulation and that is coupled (e.g. soldered) to the first carrier 110 and/or to the second carrier 120. The external part 141 and the internal part 142 may form a central body of the external contact 140. A spring element 150 that is integrally formed with the external contact 140 may extend out of the central body, e.g. in a lateral direction. Such a spring element 150 may e.g. form a finger-like structure that extends out of the central body.

The semiconductor package 200 may have a first spacer 160 arranged on each power semiconductor chip 130. The semiconductor package 200 may further comprise one or more second spacers 220 which are not arranged atop a semiconductor chip 130 but are instead arranged laterally besides the semiconductor chip (s) of the semiconductor package 200. The one or more second spacers 220 may be arranged directly on the inner surfaces of the first and second carriers 110, 120 (however, solder layers may be arranged between the second spacer(s) 220 and the inner surfaces).

First sides of the first spacers 160 and the second spacers 220 facing the first carrier 110 may be arranged in a common plane. A part of the spring elements 150 facing the first carrier 110 (e.g. the first arc 151, compare FIG. 1A) may protrude beyond the common plane in the stage of fabrication of semiconductor package 200 shown in FIG. 2 (before she first carrier 110 is arranged above she second carrier 120).

The detail view in FIG. 2 shows a zoom of a spring element 150. The spring element 150 may comprise a distal part 153 which may or may not connect to the central body of an external contact 140. The distal part 153 and the central body of the external contact 140 may be arranged in a common plane. The distal part 153 of the spring element 150 may be bent downwards (e.g. in the direction of the second carrier 120) out of the common plane to form the second arc 152 and then bent upwards (e.g. in the direction of the first carrier 110) to form the first arc 151.

Figure 3:
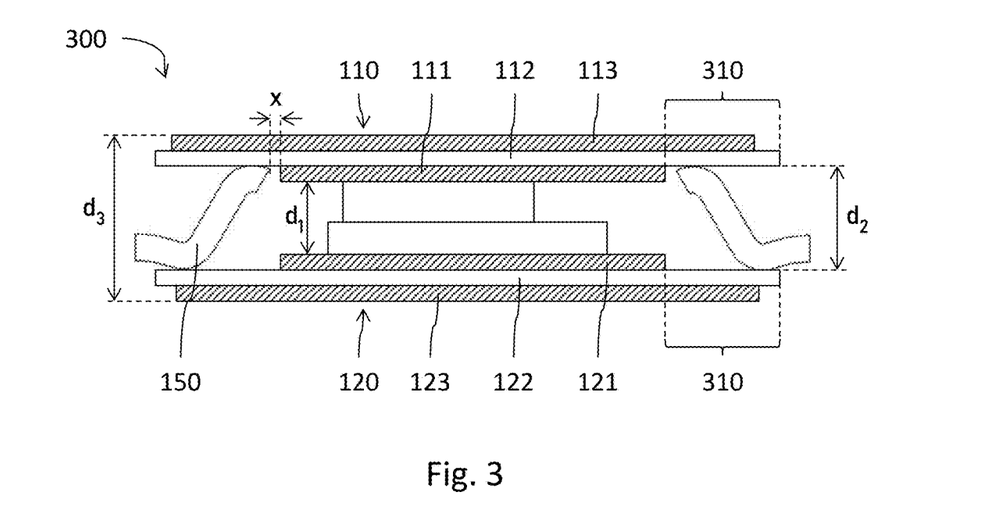
FIG. 3 shows a side view of a further semiconductor package, wherein the carriers comprise recesses and wherein the spring elements are arranged in the recesses.

FIG. 3 shows a side view of a semiconductor package 300. Semiconductor package 300 may be similar or identical to semiconductor packages 100 or 200, except for the differences described in the following.

In semiconductor package 300 the first and second carrier 110, 120 may be of the DCB or DAB type comprising respective inner electrically conductive layers 111, 121, insulating layers 112, 122 and outer conductive layers 113, 123. The first carrier 110 and/or the second carrier 120 may comprise recesses 310, wherein the respective inner conductive layer 111, 121 is removed in the recess 310. A recess 310 in the first carrier 110 and a recess 310 in the second carrier 120 may be arranged opposite to each other. The spring elements 150 may be arranged in the recesses 310. Therefore, the first arc 151 may be in direct contact with the insulating layer 112 of the first carrier 110 and/or the second arc 152 may be in direct contact with the insulating layer 122 of the second carrier 120.

The inner conductive layers 111, 121 of the carriers 110, 120 may be arranged at a distance $d_1$ from one another, wherein $d_1$ may for example be about 850 µm. The insulating layers 112, 122 on the other hand may be arranged at a distance $d_2$ from one another, wherein $d_2$ may for example be about 1450 µm. Therefore, by arranging the spring elements 150 in the recesses 310, the available spring deflection is increased. This may improve the ability of the spring elements 150 to actually exert an outward force onto the carriers 110, 120.

The semiconductor package 200 may have an overall thickness $d_3$ of about 2.8 mm. A minimum lateral distance x between the spring elements 150 and each of the inner conductive layers 111, 121 may be at least about 200 µm in order to ensure electrical insulation between the spring elements 150 and the inner conductive layers 111, 121. The area of the minimum lateral distance x may be filled with an electrically insulating material, e.g. the material of the encapsulation, in order to improve the electrical insulation between spring element 150 and inner conductive layer 111, 121.

Figure 4A:
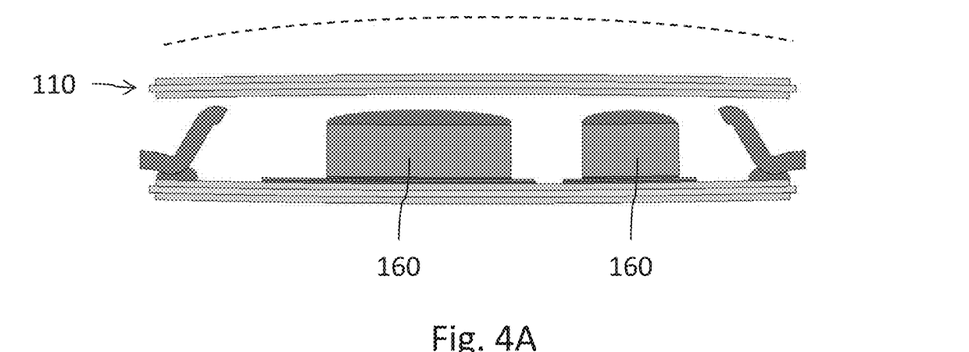
FIGS. 4A to 4C show a further semiconductor package in various stages of fabrication.
Figure 4B:
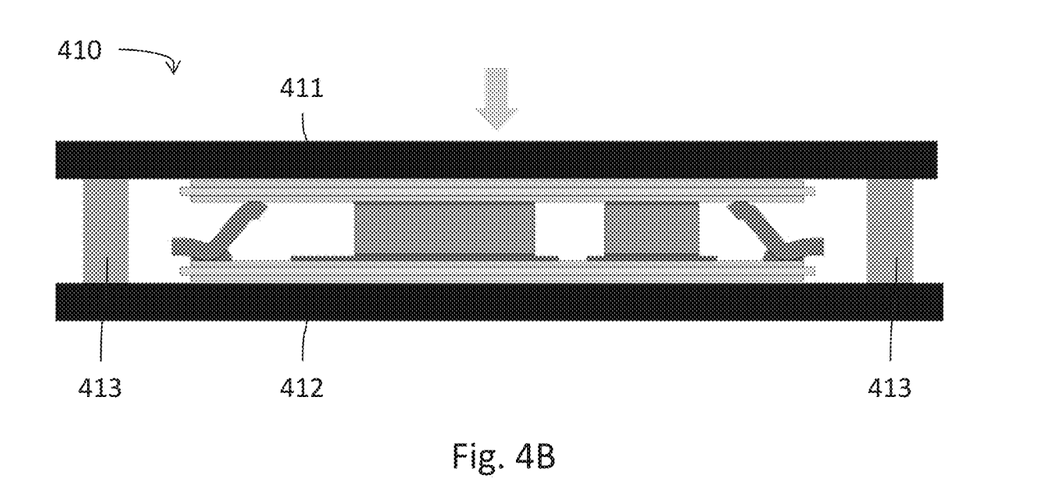
Figure 4C:
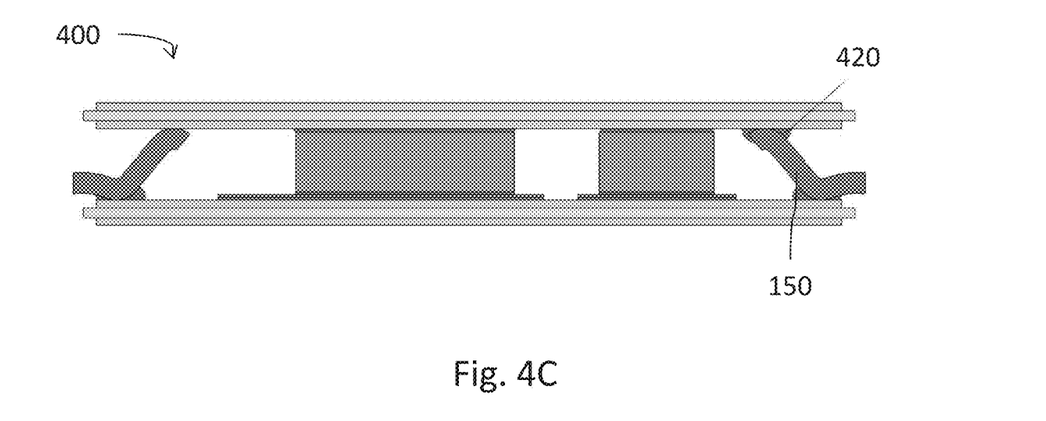

FIGS. 4A to 4C show side views of a semiconductor package 400 in various stages of fabrication. Semiconductor package 400 may be similar or identical to semiconductor packages 100, 200 or 300, except for the differences described in the following.

FIG. 4A shows the semiconductor package 400 in a stage of fabrication before the first carrier 110 is attached co the first spacers 160. The first carrier 110 (and possibly also the second carrier 120) may exhibit a curvature. For better visibility, the curvature of the first carrier 110 is overstated by the dashed line in FIG. 4A.

FIG. 4B shows a clamping tool 410 than is used to press the first and second carrier 110, 120 together. The clamping tool 410 may comprise a first holder 411 and a second holder 412 arranged opposite to each other and one or more distance elements 413 that may be configured to set a predefined distance between the first and second holders 411, 412. The distance between the first and second holders 411, 412 set by the distance element (s) 413 defines the overall thickness $d_3$ (compare FIG. 3) of the semiconductor package 400. In this arrangement, the outwards force exerted by the spring elements 150 may cooperate with the first and second holders 411, 412 to act against any curvature in the first carrier 110 indicated by the dashed line in FIG. 4A.

FIG. 4C shows the semiconductor package 400 after a fixing step in which the parts of the semiconductor package have been soldered together. The semiconductor package 400 may have an unevenness of for example less than 10 μm or even less than 2 μm.

According to an example, the spring elements 150 may be attached to the carriers 110, 120. For example, solder depots 420 may be used to attach the spring elements to the inner conductive layers 111, 121 of the carriers 110, 120. According to another example, the spring elements 150 are not attached to the carriers 110, 120 but instead may be arranged in the recces 310 and/or may be configured to slide along the respective insulating layer 112, 122 (compare e.g. FIG. 3). In such arrangements the spring elements may readily adapt such that they can exert an outwards spring force even if the distance defined by the distance element(s) 413 and the spring elements themselves vary as a result of manufacturing tolerances, to cooperate with first and second holders 411,412 to achieve flatness of the carriers 110,120. Such arrangements may in some applications avoid the need for additional isolation as the spring elements 150 do not electrically connect to the conductive parts of the carriers 110,120.

Figure 5:
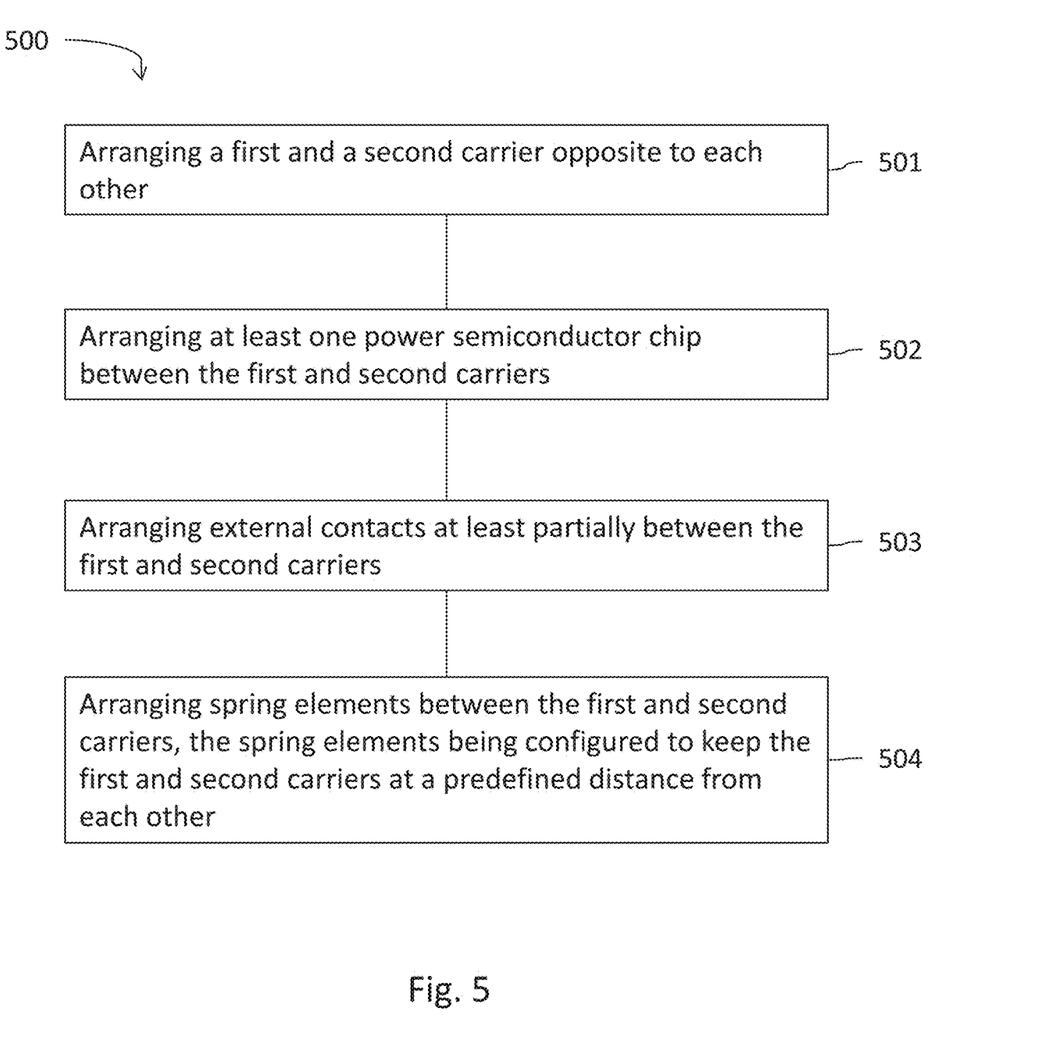
FIG. 5 shows a flow chart of a method for fabricating a semiconductor package.

FIG. 5 shows a flow chart of a method 500 for fabricating a semiconductor package. The method 500 may for example be used to fabricate the semiconductor packages 100 to 400.

The method 500 comprises at 501 arranging a first and a second carrier opposite to each other, at 502 arranging at least one power semiconductor chip between the first and second carriers, at 503 arranging external contacts at least partially between the first and second carriers, and at 504 arranging spring elements between the first and second carriers. According to method 500, the spring elements are configured to keep the first and second carriers at a predefined distance from each other.

According to an example, the method 500 further comprises providing opposing recesses in the first and second carriers, wherein each carrier comprises an inner conductive layer facing the at least one power semiconductor chip, an insulating layer and an outer conductive layer, and wherein the inner conductive layers are removed in the recesses and wherein each spring element is arranged in a recess.

According to a further example of method 500, the spring elements and the external contacts may be parts of a leadframe. Method 500 may comprise bending the leadframe in order to provide the spring elements. Such a bending may for example be done using a stamping apparatus.

Furthermore, method 500 may entail encapsulating the at least one power semiconductor chip with a mold material. The mold material may be arranged between the spring elements and the inner conductive layers of the first and second carrier, for example in order to provide adequate electrical insulation between the spring elements and the first and second carriers. The flatness of the outer carriers in such arrangements may be good as a result of the force exerted by spring elements 150 in combination with first and second holders 411, 412 during manufacturing. This in turn may lead to a more exact and consistent thickness of the finished package with smaller manufacturing variations.

In the following, the semiconductor package and the method for fabricating a semiconductor package are further described using specific examples.

Example 1 is a package for double sided cooling, the semiconductor package comprising a first and a second carrier facing each other, at least one power semiconductor chip arranged between the first and second carriers, external contacts arranged at least partially between the first and second carriers, and spring elements arranged between the first and second carriers.

Example 2 is the semiconductor package of example 1, wherein the external contacts and the spring elements are parts of a leadframe.

Example 3 is the semiconductor package of example 1 or 2, wherein each spring element is integrally, in particular monolithically, formed with one of the external contacts.

Example 4 is the semiconductor package of one of the preceding examples, wherein the first and second carriers each comprise an inner conductive layer facing the at least one power semiconductor chip, an insulating layer and an outer conductive layer, and wherein the first and second carriers comprise opposing recesses, wherein the inner conductive layer of the first and second carriers is removed in the recesses and wherein each spring element is arranged in a recess.

Example 5 is a semiconductor package of one of the preceding examples, wherein the spring elements essentially have an S-shape.

Example 6 is the semiconductor package of example 5, wherein the external contacts are arranged in a common plane and wherein the spring elements are bent upwards and downwards out of the plane.

Example 7 is the semiconductor package of example 5 or example 6, wherein a first arc of the S-shape touches the insulating layer of the first carrier and wherein a second arc of the S-shape touches the insulating layer of the second carrier.

Example 8 is the semiconductor package of example 7, wherein one or more of the first arc and the second arc are configured to slide along the respective insulating layer.

Example 9 is the semiconductor package of one of the preceding examples, wherein each of the spring elements is arranged in a corner of the semiconductor package.

Example 10 is a method for fabricating a semiconductor package, the method comprising: arranging a first and a second carrier opposite to each other, arranging at least one power semiconductor chip between the first and second carriers, arranging external contacts at least partially between the first and second carriers, and arranging spring elements between the first and second carriers, the spring elements being configured to keep the first and second carriers at a predefined distance from each other.

Example 11 is a method for fabricating a semiconductor package, the method comprising: arranging a first and a second carrier opposite to each other, arranging at least one power semiconductor chip between the first and second carriers, arranging external contacts at least partially between the first and second carriers, arranging spring elements between the first and second carriers, the spring elements being arranged around the at least one power semiconductor chip to exert a force on the first and second carriers; and carrying out a fixing step to fix the second carrier to the at least one power semiconductor chip on the first carrier, the spring elements being configured to urge the first and second carriers apart to be a predefined distance from each other.

Example 12 is the method of example 10, further comprising: providing opposing recesses in the first and second carriers, wherein each carrier comprises an inner conductive layer facing the at least one power semiconductor chip, an insulating layer and an outer conductive layer, and wherein the inner conductive layers are removed in the recesses and wherein each spring element is arranged in a recess.

Example 13 is the method of example 11 or 12, wherein the external contacts and the spring elements are provided as parts of a common leadframe.

Example 14 is the method of example 13, further comprising: bending the leadframe in order to provide the spring elements.

Example 15 is the method of one of examples 12 to 14, further comprising: encapsulating the at least one power semiconductor chip with a mold material, wherein the mold material is arranged between the spring elements and the inner conductive layers of the first and second carrier.

Example 16 is the method of one of examples 9 to 15, further comprising: pressing the first and second carriers towards each other against a pressure exerted by the spring elements.

Example 17 is an apparatus comprising means for performing the method of one of examples 9 to 16.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor package for double sided cooling, the semiconductor package comprising:
   a first carrier and a second carrier facing each other;
   at least one power semiconductor chip arranged between the first carrier and the second carrier;
   external contacts arranged between the first carrier and the second carrier; and
   spring elements arranged between the first carrier and the second carrier,
   wherein both the first carrier and the second carrier each comprise an inner conductive layer facing the at least one power semiconductor chip, an insulating layer and an outer conductive layer,
   wherein the first carrier comprises a recess in which the inner conductive layer of the first carrier is absent,
   wherein the second carrier comprises a recess in which the inner conductive layer of the second carriers is absent,
   wherein the recess in the first carrier and the recess in the second carrier are arranged opposite to each other,
   wherein each spring element is arranged in a recess.

2. The semiconductor package of claim 1, wherein the external contacts and the spring elements are parts of a leadframe.

3. The semiconductor package of claim 1, wherein each spring element is monolithically formed with one of the external contacts.

4. The semiconductor package of claim 1, wherein the spring elements have an S-shape.

5. The semiconductor package of claim 4, wherein the external contacts are arranged in a common plane, and wherein the spring elements are bent upwards and downwards out of the plane.

6. The semiconductor package of claim 4, wherein a first arc of the S-shape touches the insulating layer of the first carrier, and wherein a second arc of the S-shape touches the insulating layer of the second carrier.

7. The semiconductor package of claim 6, wherein one or more of the first arc and the second arc is configured to slide along the respective insulating layer.

8. The semiconductor package of claim 1, wherein each of the spring elements is arranged in a corner of the semiconductor package.

9. A method for fabricating a semiconductor package, the method comprising:
   arranging a first carrier and a second carrier opposite to each other;
   arranging at least one power semiconductor chip between the first carrier and the second carrier;
   arranging external contacts between the first carrier and the second carrier;
   arranging spring elements between the first carrier and the second carrier, the spring elements being arranged around the at least one power semiconductor chip to exert a force on the first carrier and the second carrier; and
   carrying out a fixing step to fix the second carrier to the at least one power semiconductor chip on the first carrier, the spring elements being configured to force the first carrier and the second carrier apart to be a predefined distance from each other.

10. The method of claim 9, further comprising:
    providing a recess in the first carrier and a recess in the second carrier,
    wherein the recess in the first carrier and the recess in the second carrier are arranged opposite to each other,
    wherein each carrier comprises an inner conductive layer facing the at least one power semiconductor chip, an insulating layer and an outer conductive layer,
    wherein the inner conductive layer of the first carrier is removed in the recess in the first carrier,
    wherein the inner conductive layer of the second carrier is removed in the recess in the second carrier, and
    wherein each spring element is arranged in a recess.

11. The method of claim 9, wherein the external contacts and the spring elements are provided as parts of a common leadframe.

12. The method of claim 11, further comprising:
    bending the leadframe to form the spring elements.

13. The method of claim 9, further comprising:
    encapsulating the at least one power semiconductor chip with a mold material,
    wherein the mold material is arranged between the spring elements and the inner conductive layers of the first and second carriers.

14. The method of claim 9, further comprising:
pressing the first carrier and the second carrier towards each other against a pressure exerted by the spring elements.

15. The method of claim 9, wherein the fixing step is a solder reflow step to reflow solder at least between at least one power semiconductor chip and the second carrier.

16. A semiconductor package for double sided cooling, the semiconductor package comprising:
a first carrier and a second carrier facing each other;
at least one power semiconductor chip arranged between the first carrier and the second carrier;
external contacts arranged between the first carrier and the second carrier; and
spring elements arranged between the first carrier and the second carrier, the spring elements having an S-shape.

* * * * *